US009607191B1

United States Patent
Peach et al.

(10) Patent No.: US 9,607,191 B1
(45) Date of Patent: Mar. 28, 2017

(54) RFID TAG MEMORY CHECK USING WIRELESS MARGIN READ COMMANDS

(71) Applicant: Impinj, Inc., Seattle, WA (US)

(72) Inventors: Charles Peach, Kirkland, WA (US); Alberto Pesavento, Seattle, WA (US); Theron Stanford, Seattle, WA (US); Jay Kuhn, Seattle, WA (US); Christopher Diorio, Shoreline, WA (US)

(73) Assignee: Impinj, Inc., Seattle, WA (US)

( * ) Notice: Subject to any disclaimer, the term of this patent is extended or adjusted under 35 U.S.C. 154(b) by 0 days.

(21) Appl. No.: 14/737,384

(22) Filed: Jun. 11, 2015

Related U.S. Application Data

(60) Provisional application No. 62/011,539, filed on Jun. 12, 2014.

(51) Int. Cl.
*G11C 16/34* (2006.01)
*G06K 7/10* (2006.01)

(52) U.S. Cl.
CPC ..... *G06K 7/10227* (2013.01); *G06K 7/10207* (2013.01)

(58) Field of Classification Search
CPC .................................................. G11C 16/3459
USPC ................... 340/12.51, 13.26, 10.1
See application file for complete search history.

(56) References Cited

U.S. PATENT DOCUMENTS

| 2006/0245248 | A1* | 11/2006 | Hu ...................... G11C 16/3495 365/185.09 |
| 2007/0115016 | A1* | 5/2007 | Chang ................ G01R 31/2822 324/750.3 |
| 2007/0203662 | A1* | 8/2007 | Sugiyama ........ G01R 31/31701 702/117 |

* cited by examiner

*Primary Examiner* — Kevin Kim
(74) *Attorney, Agent, or Firm* — Turk IP Law, LLC

(57) ABSTRACT

Data stored in nonvolatile memory on a Radio Frequency Identification (RFID) tag integrated circuit may have a "margin" associated with how strongly the data is written to the memory. Upon receiving a wireless margin read command, the RFID IC determines whether the margin for one of more data values stored in memory exceeds a margin threshold. The IC may determine the margin by applying bias voltages or currents to the memory cells storing the data values. If the determined margin does not exceed the margin threshold, the IC may respond with an error code.

17 Claims, 11 Drawing Sheets

SIGNAL PATH DURING R→T

SIGNAL PATH DURING T→R

*RFID READER SYSTEM CONFIGURATION WITH OPTIONAL LOCAL AND REMOTE COMPONENTS*

800

850

| | 1302 COMMAND CODE | 1304 MEMORY TYPE | 1306 BIT POINTER | 1308 LENGTH | 1310 MASK | 1312 RN | 1314 CRC |
|---|---|---|---|---|---|---|---|
| NUMBER OF BITS | 16 | 2 | EBV | 8 | VARIABLE | 16 | 16 |

1300

| | 1352 HEADER | 1354 RN | 1356 CRC |
|---|---|---|---|
| NUMBER OF BITS | 1 | 16 | 16 |

RFID TAG MEMORY CHECK USING WIRELESS MARGIN READ COMMANDS

CROSS REFERENCE TO RELATED APPLICATIONS

This application claims the benefit of U.S. Provisional Patent Application Ser. No. 62/011,539 filed on Jun. 12, 2014. The disclosures of the above application are hereby incorporated by reference for all purposes.

BACKGROUND

Radio-Frequency Identification (RFID) systems typically include RFID readers, also known as RFID reader/writers or RFID interrogators, and RFID tags. RFID systems can be used in many ways for locating and identifying objects to which the tags are attached. RFID systems are useful in product-related and service-related industries for tracking objects being processed, inventoried, or handled. In such cases, an RFID tag is usually attached to an individual item, or to its package.

In principle, RFID techniques entail using an RFID reader to inventory one or more RFID tags, where inventorying involves at least singulating a tag and receiving an identifier from the singulated tag. "Singulated" is defined as a reader singling-out one tag, potentially from among multiple tags, for a reader-tag dialog. "Identifier" is defined as a number identifying the tag or the item to which the tag is attached, such as a tag identifier (TID), electronic product code (EPC), etc. The reader transmitting a Radio-Frequency (RF) wave performs the interrogation. The RF wave is typically electromagnetic, at least in the far field. The RF wave can also be predominantly electric or magnetic in the near or transitional near field. The RF wave may encode one or more commands that instruct the tags to perform one or more actions.

In typical RFID systems, an RFID reader transmits a modulated RF inventory signal (a command), receives a tag reply, and transmits an RF acknowledgement signal responsive to the tag reply. A tag that senses the interrogating RF wave may respond by transmitting back another RF wave. The tag either generates the transmitted back RF wave originally, or by reflecting back a portion of the interrogating RF wave in a process known as backscatter. Backscatter may take place in a number of ways.

The reflected-back RF wave may encode data stored in the tag, such as a number. The response is demodulated and decoded by the reader, which thereby identifies, counts, or otherwise interacts with the associated item. The decoded data can denote a serial number, a price, a date, a time, a destination, an encrypted message, an electronic signature, other attribute(s), any combination of attributes, and so on. Accordingly, when a reader receives tag data it can learn about the item that hosts the tag and/or about the tag itself.

An RFID tag typically includes an antenna section, a radio section, a power-management section, and frequently a logical section, a memory, or both. In some RFID tags the power-management section included an energy storage device such as a battery. RFID tags with an energy storage device are known as battery-assisted, semi-active, or active tags. Other RFID tags can be powered solely by the RF signal they receive. Such RFID tags do not include an energy storage device and are called passive tags. Of course, even passive tags typically include temporary energy- and data/flag-storage elements such as capacitors or inductors.

BRIEF SUMMARY

This summary is provided to introduce a selection of concepts in a simplified form that are further described below in the Detailed Description. This summary is not intended to identify key features or essential features of the claimed subject matter, nor is it intended as an aid in determining the scope of the claimed subject matter.

Embodiments are directed to determining data write strength, also referred to as "margin", for data stored in nonvolatile memory on a Radio Frequency Identification (RFID) tag integrated circuit. Upon receiving a wireless margin read command, the RFID IC determines whether the margin for one of more data values stored in memory exceeds a margin threshold. The IC may determine the margin by applying bias voltages or currents to the memory cells storing the data values. If the determined margin does not exceed the margin threshold, the IC may respond with an error code.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

The following Detailed Description proceeds with reference to the accompanying drawings, in which:

FIG. 13 depicts example structures for a margin read command and a response to a margin read command, according to embodiments.

DETAILED DESCRIPTION

In the following detailed description, references are made to the accompanying drawings that form a part hereof, and in which are shown by way of illustration specific embodiments or examples. These embodiments or examples may be combined, other aspects may be utilized, and structural changes may be made without departing from the spirit or scope of the present disclosure. The following detailed description is therefore not to be taken in a limiting sense, and the scope of the present invention is defined by the appended claims and their equivalents.

As used herein, "memory" is one of ROM, RAM, SRAM, DRAM, NVM, EEPROM, FLASH, Fuse, MRAM, FRAM, and other similar information-storage technologies as will be known to those skilled in the art. Some portions of memory may be writeable and some not. "Command" refers to a reader request for one or more tags to perform one or more actions, and includes one or more tag instructions preceded by a command identifier or command code that identifies the command and/or the tag instructions. "Instruction" refers to a request to a tag to perform a single explicit action (e.g., write data into memory). "Program" refers to a request to a tag to perform a set or sequence of instructions (e.g., read a value from memory and, if the read value is less than a threshold then lock a memory word). "Protocol" refers to an industry standard for communications between a reader and a tag (and vice versa), such as the Class-1 Generation-2 UHF RFID Protocol for Communications at 860 MHz-960 MHz by GS1 EPCglobal, Inc. ("Gen2 Specification"), versions 1.2.0 and 2.0 of which are hereby incorporated by reference.

Figure 1:
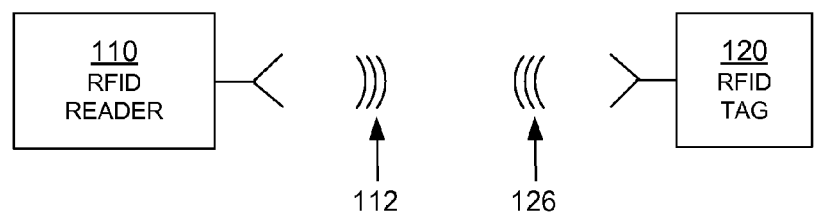
FIG. 1 is a block diagram of components of an RFID system.

FIG. 1 is a diagram of the components of a typical RFID system 100, incorporating embodiments. An RFID reader 110 transmits an interrogating RF signal 112. RFID tag 120 in the vicinity of RFID reader 110 senses interrogating RF signal 112 and generate signal 126 in response. RFID reader 110 senses and interprets signal 126. The signals 112 and 126 may include RF waves and/or non-propagating RF signals (e.g., reactive near-field signals)

Reader 110 and tag 120 communicate via signals 112 and 126. When communicating, each encodes, modulates, and transmits data to the other, and each receives, demodulates, and decodes data from the other. The data can be modulated onto, and demodulated from, RF waveforms. The RF waveforms are typically in a suitable range of frequencies, such as those near 900 MHz, 13.56 MHz, and so on.

The communication between reader and tag uses symbols, also called RFID symbols. A symbol can be a delimiter, a calibration value, and so on. Symbols can be implemented for exchanging binary data, such as "0" and "1", if that is desired. When symbols are processed by reader 110 and tag 120 they can be treated as values, numbers, and so on.

Tag 120 can be a passive tag, or an active or battery-assisted tag (i.e., a tag having its own power source). When tag 120 is a passive tag, it is powered from signal 112.

Figure 2:
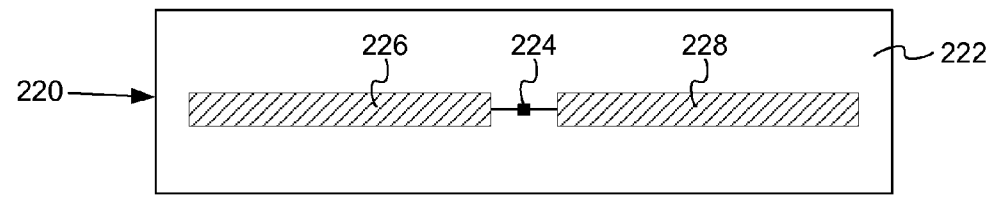
FIG. 2 is a diagram showing components of a passive RFID tag, such as a tag that can be used in the system of FIG. 1.
Figure 2:
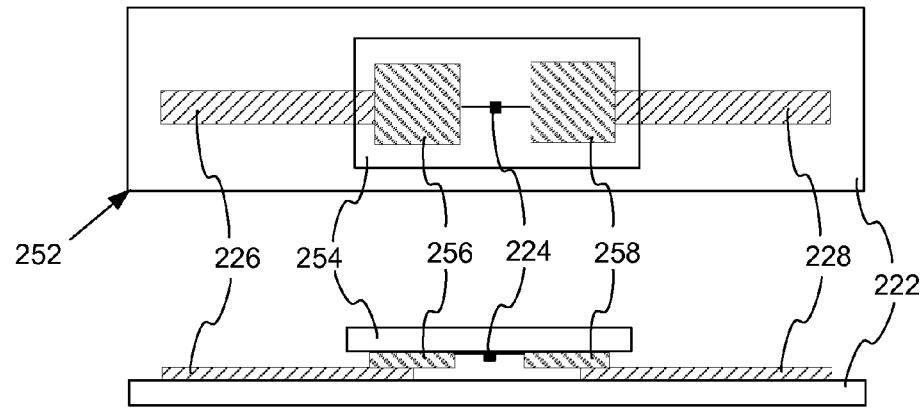
Figure 2:
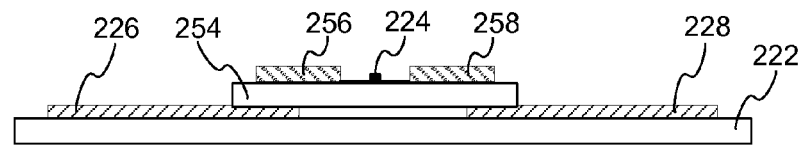

FIG. 2 is a diagram of an RFID tag 220, which may function as tag 120 of FIG. 1. Tag 220 is drawn as a passive tag, meaning it does not have its own power source. Much of what is described in this document, however, applies also to active and battery-assisted tags.

Tag 220 is typically (although not necessarily) formed on a substantially planar inlay 222, which can be made in many ways known in the art. Tag 220 includes a circuit which may be implemented as an IC 224. In some embodiments IC 224 is implemented in complementary metal-oxide semiconductor (CMOS) technology. In other embodiments IC 224 may be implemented in other technologies such as bipolar junction transistor (BJT) technology, metal-semiconductor field-effect transistor (MESFET) technology, and others as will be well known to those skilled in the art. IC 224 is arranged on inlay 222.

Tag 220 also includes an antenna for exchanging wireless signals with its environment. The antenna is often flat and attached to inlay 222. IC 224 is electrically coupled to the antenna via suitable IC contacts (not shown in FIG. 2). The term "electrically coupled" as used herein may mean a direct electrical connection, or it may mean a connection that includes one or more intervening circuit blocks, elements, or devices. The "electrical" part of the term "electrically coupled" as used in this document shall mean a coupling that is one or more of ohmic/galvanic, capacitive, and/or inductive. Similarly, the term "electrically isolated" as used herein means that electrical coupling of one or more types (e.g., galvanic, capacitive, and/or inductive) is not present, at least to the extent possible. For example, elements that are electrically isolated from each other are galvanically isolated from each other, capacitively isolated from each other, and/or inductively isolated from each other. Of course, electrically isolated components will generally have some unavoidable stray capacitive or inductive coupling between them, but the intent of the isolation is to minimize this stray coupling to a negligible level when compared with an electrically coupled path.

IC 224 is shown with a single antenna port, comprising two IC contacts electrically coupled to two antenna segments 226 and 228 which are shown here forming a dipole. Many other embodiments are possible using any number of ports, contacts, antennas, and/or antenna segments.

Diagram 250 depicts top and side views of tag 252, formed using a strap. Tag 252 differs from tag 220 in that it includes a substantially planar strap substrate 254 having strap contacts 256 and 258. IC 224 is mounted on strap substrate 254 such that the IC contacts on IC 224 electrically couple to strap contacts 256 and 258 via suitable connections (not shown). Strap substrate 254 is then placed on inlay 222 such that strap contacts 256 and 258 electrically couple to antenna segments 226 and 228. Strap substrate 254 may be affixed to inlay 222 via pressing, an interface layer, one or more adhesives, or any other suitable means.

Diagram 260 depicts a side view of an alternative way to place strap substrate 254 onto inlay 222. Instead of strap substrate 254's surface, including strap contacts 256/258, facing the surface of inlay 222, strap substrate 254 is placed with its strap contacts 256/258 facing away from the surface of inlay 222. Strap contacts 256/258 can then be either capacitively coupled to antenna segments 226/228 through strap substrate 254, or conductively coupled using a through-via which may be formed by crimping strap contacts 256/258 to antenna segments 226/228. In some embodiments the positions of strap substrate 254 and inlay 222 may be reversed, with strap substrate 254 mounted beneath inlay 222 and strap contacts 256/258 electrically coupled to antenna segments 226/228 through inlay 222. Of course, in yet other embodiments strap contacts 256/258 may electrically couple to antenna segments 226/228 through both inlay 222 and strap substrate 254.

In operation, the antenna receives a signal and communicates it to IC 224, which both harvests power and responds if appropriate, based on the incoming signal and the IC's internal state. If IC 224 uses backscatter modulation then it responds by modulating the antenna's reflectance, which generates response signal 126 from signal 112 transmitted by the reader. Electrically coupling and uncoupling the IC contacts of IC 224 can modulate the antenna's reflectance, as can varying the admittance of a shunt-connected circuit element which is coupled to the IC contacts. Varying the impedance of a series-connected circuit element is another means of modulating the antenna's reflectance.

In the embodiments of FIG. 2, antenna segments 226 and 228 are separate from IC 224. In other embodiments the antenna segments may alternatively be formed on IC 224. Tag antennas according to embodiments may be designed in any form and are not limited to dipoles. For example, the tag antenna may be a patch, a slot, a loop, a coil, a horn, a spiral, a monopole, microstrip, stripline, or any other suitable antenna.

The components of the RFID system of FIG. 1 may communicate with each other in any number of modes. One such mode is called full duplex. Another such mode is called half-duplex, and is described below.

Figure 3:
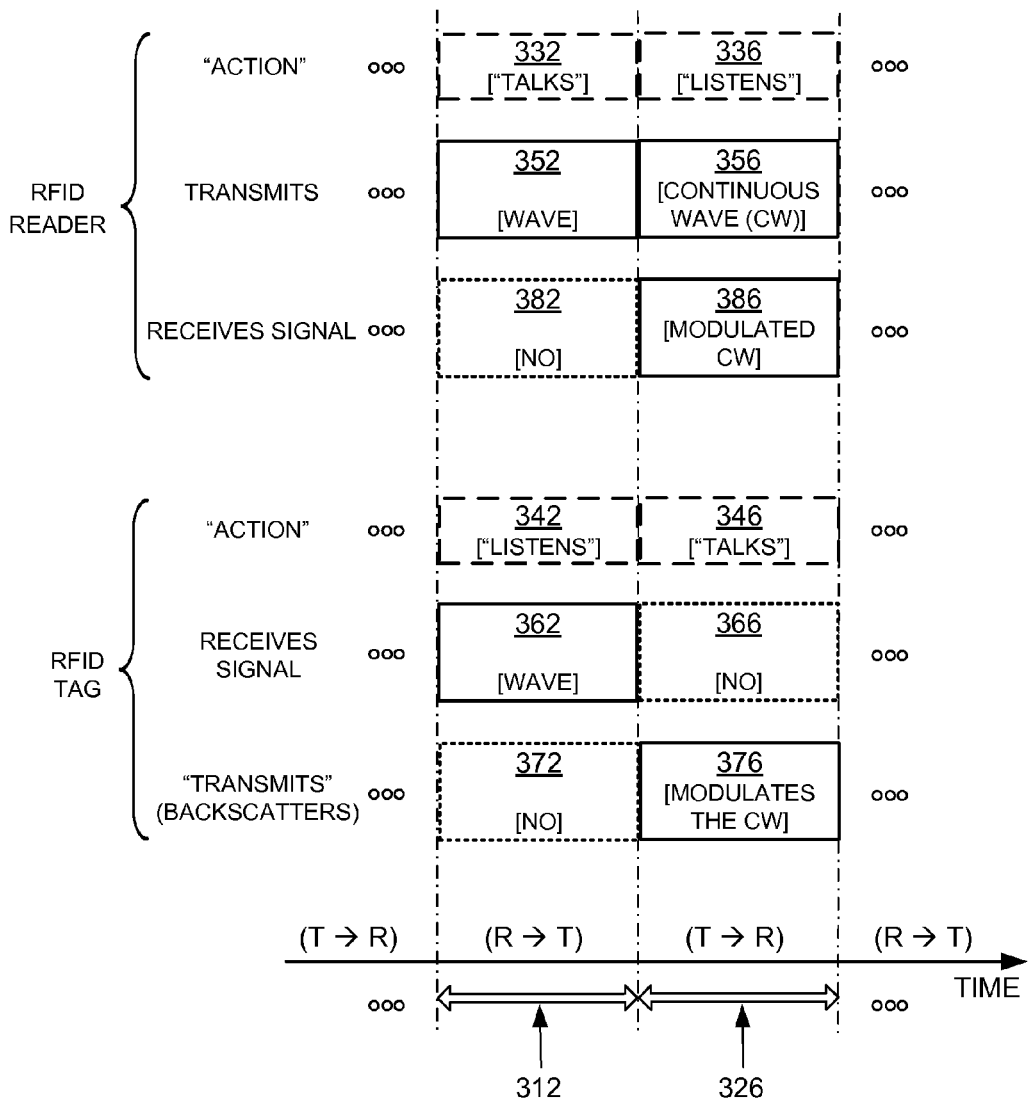
FIG. 3 is a conceptual diagram for explaining a half-duplex mode of communication between the components of the RFID system of FIG. 1.

FIG. 3 is a conceptual diagram 300 for explaining half-duplex communications between the components of the RFID system of FIG. 1, in this case with tag 120 implemented as passive tag 220 of FIG. 2. The explanation is made with reference to a TIME axis, and also to a human metaphor of "talking" and "listening". The actual technical implementations for "talking" and "listening" are now described.

RFID reader 110 and RFID tag 120 talk and listen to each other by taking turns. As seen on axis TIME, when reader 110 talks to tag 120 the communication session is designated as "R→T", and when tag 120 talks to reader 110 the communication session is designated as "T→R". Along the TIME axis, a sample R→T communication session occurs during a time interval 312, and a following sample T→R communication session occurs during a time interval 326. Of course interval 312 is typically of a different duration than interval 326—here the durations are shown approximately equal only for purposes of illustration.

According to blocks 332 and 336, RFID reader 110 talks during interval 312, and listens during interval 326. According to blocks 342 and 346, RFID tag 120 listens while reader 110 talks (during interval 312), and talks while reader 110 listens (during interval 326).

In terms of actual behavior, during interval 312 reader 110 talks to tag 120 as follows. According to block 352, reader 110 transmits signal 112, which was first described in FIG. 1. At the same time, according to block 362, tag 120 receives signal 112 and processes it to extract data and so on. Meanwhile, according to block 372, tag 120 does not backscatter with its antenna, and according to block 382, reader 110 has no signal to receive from tag 120.

During interval 326, tag 120 talks to reader 110 as follows. According to block 356, reader 110 transmits a Continuous Wave (CW) signal, which can be thought of as a carrier that typically encodes no information. This CW signal serves both to transfer energy to tag 120 for its own internal power needs, and also as a carrier that tag 120 can modulate with its backscatter. Indeed, during interval 326, according to block 366, tag 120 does not receive a signal for processing. Instead, according to block 376, tag 120 modulates the CW emitted according to block 356 so as to generate backscatter signal 126. Concurrently, according to block 386, reader 110 receives backscatter signal 126 and processes it.

Figure 4:
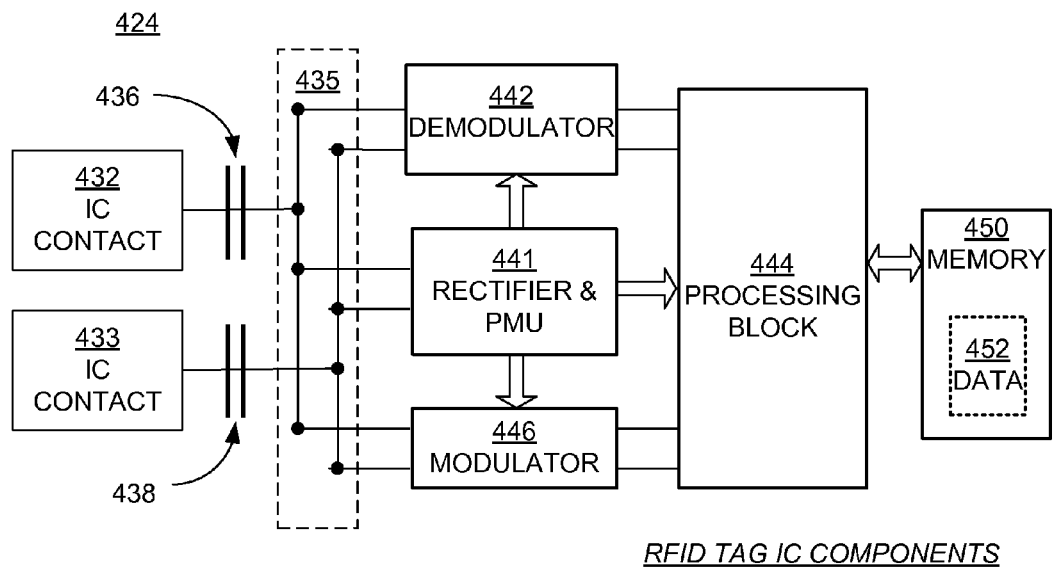
FIG. 4 is a block diagram showing a detail of an RFID tag, such as the one shown in FIG. 2.

FIG. 4 is a block diagram showing a detail of an RFID IC, such as IC 224 in FIG. 2. Electrical circuit 424 in FIG. 4 may be formed in an IC of an RFID tag, such as tag 220 of FIG. 2. Circuit 424 has a number of main components that are described in this document. Circuit 424 may have a number of additional components from what is shown and described, or different components, depending on the exact implementation.

Circuit 424 shows two IC contacts 432, 433, suitable for coupling to antenna segments such as antenna segments 226/228 of RFID tag 220 of FIG. 2. When two IC contacts form the signal input from and signal return to an antenna they are often referred-to as an antenna port. IC contacts 432, 433 may be made in any suitable way, such as from metallic pads and so on. In some embodiments circuit 424 uses more than two IC contacts, especially when tag 220 has more than one antenna port and/or more than one antenna.

Circuit 424 includes signal-routing section 435 which may include signal wiring, signal-routing busses, receive/transmit switches, and so on that can route a signal to the components of circuit 424. In some embodiments IC contacts 432/433 couple galvanically and/or inductively to signal-routing section 435. In other embodiments (such as is shown in FIG. 4) circuit 424 includes optional capacitors 436 and/or 438 which, if present, capacitively couple IC contacts 432/433 to signal-routing section 435. This capacitive coupling causes IC contacts 432/433 to be galvanically decoupled from signal-routing section 435 and other circuit components.

Capacitive coupling (and resultant galvanic decoupling) between IC contacts 432 and/or 433 and components of circuit 424 is desirable in certain situations. For example, in some RFID tag embodiments IC contacts 432 and 433 may galvanically connect to terminals of a tuning loop on the tag. In this situation, capacitors 436 and/or 438 galvanically decouple IC contact 432 from IC contact 433, thereby preventing the formation of a short circuit between the IC contacts through the tuning loop.

Capacitors 436/438 may be implemented within circuit 424 and/or partly or completely external to circuit 424. For example, a dielectric or insulating layer on the surface of the IC containing circuit 424 may serve as the dielectric in capacitor 436 and/or capacitor 438. As another example, a dielectric or insulating layer on the surface of a tag substrate (e.g., inlay 222 or strap substrate 254) may serve as the dielectric in capacitors 436/438. Metallic or conductive layers positioned on both sides of the dielectric layer (i.e., between the dielectric layer and the IC and between the dielectric layer and the tag substrate) may then serve as terminals of the capacitors 436/438. The conductive layers may include IC contacts (e.g., IC contacts 432/433), antenna segments (e.g., antenna segments 226/228), or any other suitable conductive layers.

Circuit 424 also includes a rectifier and PMU (Power Management Unit) 441 that harvests energy from the RF signal received by antenna segments 226/228 to power the circuits of IC 424 during either or both reader-to-tag (R→T) and tag-to-reader (T→R) sessions. Rectifier and PMU 441 may be implemented in any way known in the art.

Circuit 424 additionally includes a demodulator 442 that demodulates the RF signal received via IC contacts 432, 433. Demodulator 442 may be implemented in any way known in the art, for example including a slicer, an amplifier, and so on.

Circuit 424 further includes a processing block 444 that receives the output from demodulator 442 and performs operations such as command decoding, memory interfacing, and so on. In addition, processing block 444 may generate an output signal for transmission. Processing block 444 may be implemented in any way known in the art, for example by combinations of one or more of a processor, memory, decoder, encoder, and so on.

Circuit 424 additionally includes a modulator 446 that modulates an output signal generated by processing block 444. The modulated signal is transmitted by driving IC contacts 432, 433, and therefore driving the load presented by the coupled antenna segment or segments. Modulator 446 may be implemented in any way known in the art, for example including a switch, driver, amplifier, and so on.

In one embodiment, demodulator 442 and modulator 446 may be combined in a single transceiver circuit. In another embodiment modulator 446 may modulate a signal using backscatter. In another embodiment modulator 446 may include an active transmitter. In yet other embodiments demodulator 442 and modulator 446 may be part of processing block 444.

Circuit 424 additionally includes a memory 450 to store data 452. At least a portion of memory 450 is preferably implemented as a nonvolatile memory (NVM), which means that data 452 is retained even when circuit 424 does not have power, as is frequently the case for a passive RFID tag.

In some embodiments, particularly in those with more than one antenna port, circuit 424 may contain multiple demodulators, rectifiers, PMUs, modulators, processing blocks, and/or memories.

In terms of processing a signal, circuit 424 operates differently during a R→T session and a T→R session. The different operations are described below, in this case with circuit 424 representing an IC of an RFID tag.

Figure 5A:
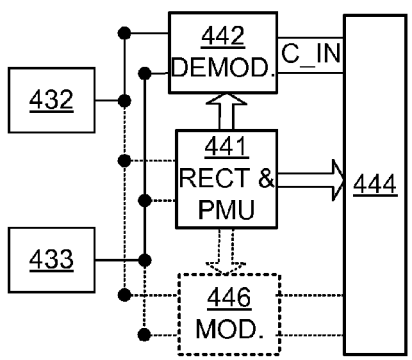
FIGS. 5A and 5B illustrate signal paths during tag-to-reader and reader-to-tag communications in the block diagram of FIG. 4.

FIG. 5A shows version 524-A of components of circuit 424 of FIG. 4, further modified to emphasize a signal operation during a R→T session during time interval 312 of FIG. 3. Demodulator 442 demodulates an RF signal received from IC contacts 432, 433. The demodulated signal is provided to processing block 444 as C_IN. In one embodiment, C_IN may include a received stream of symbols.

Version 524-A shows as relatively obscured those components that do not play a part in processing a signal during a R→T session. Rectifier and PMU 441 may be active, such as for converting RF power. Modulator 446 generally does not transmit during a R→T session, and typically does not interact with the received RF signal significantly, either because switching action in section 435 of FIG. 4 decouples modulator 446 from the RF signal, or by designing modulator 446 to have a suitable impedance, and so on.

Although modulator 446 is typically inactive during a R→T session, it need not be so. For example, during a R→T session modulator 446 could be adjusting its own parameters for operation in a future session, and so on.

Figure 5B:
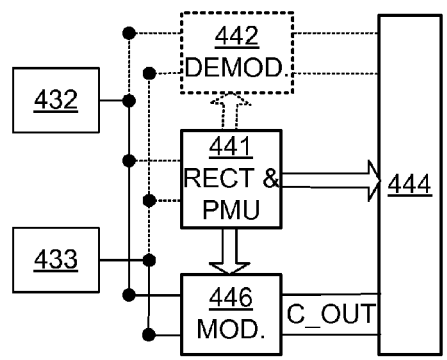

FIG. 5B shows version 524-B of components of circuit 424 of FIG. 4, further modified to emphasize a signal operation during a T→R session during time interval 326 of FIG. 3. Processing block 444 outputs a signal C_OUT. In one embodiment, C_OUT may include a stream of symbols for transmission. Modulator 446 then modulates C_OUT and provides it to antenna segments such as segments 226/228 of RFID tag 220 via IC contacts 432, 433.

Version 524-B shows as relatively obscured those components that do not play a part in processing a signal during a T→R session. Rectifier and PMU 441 may be active, such as for converting RF power. Demodulator 442 generally does not receive during a T→R session, and typically does not interact with the transmitted RF signal significantly, either because switching action in section 435 of FIG. 4 decouples demodulator 442 from the RF signal, or by designing demodulator 442 to have a suitable impedance, and so on.

Although demodulator 442 is typically inactive during a T→R session, it need not be so. For example, during a T→R session demodulator 442 could be adjusting its own parameters for operation in a future session, and so on.

In typical embodiments, demodulator 442 and modulator 446 are operable to demodulate and modulate signals according to a protocol, such as the Gen2 Specification mentioned above. In embodiments where circuit 424 includes multiple demodulators and/or modulators, each may be configured to support different protocols or different sets of protocols. A protocol specifies, in part, symbol encodings, and may include a set of modulations, rates, timings, or any other parameter associated with data communications. In addition, a protocol can be a variant of a stated specification such as the Gen2 Specification, for example including fewer or additional commands than the stated specification calls for, and so on. In such instances, additional commands are sometimes called custom commands.

Figure 6:
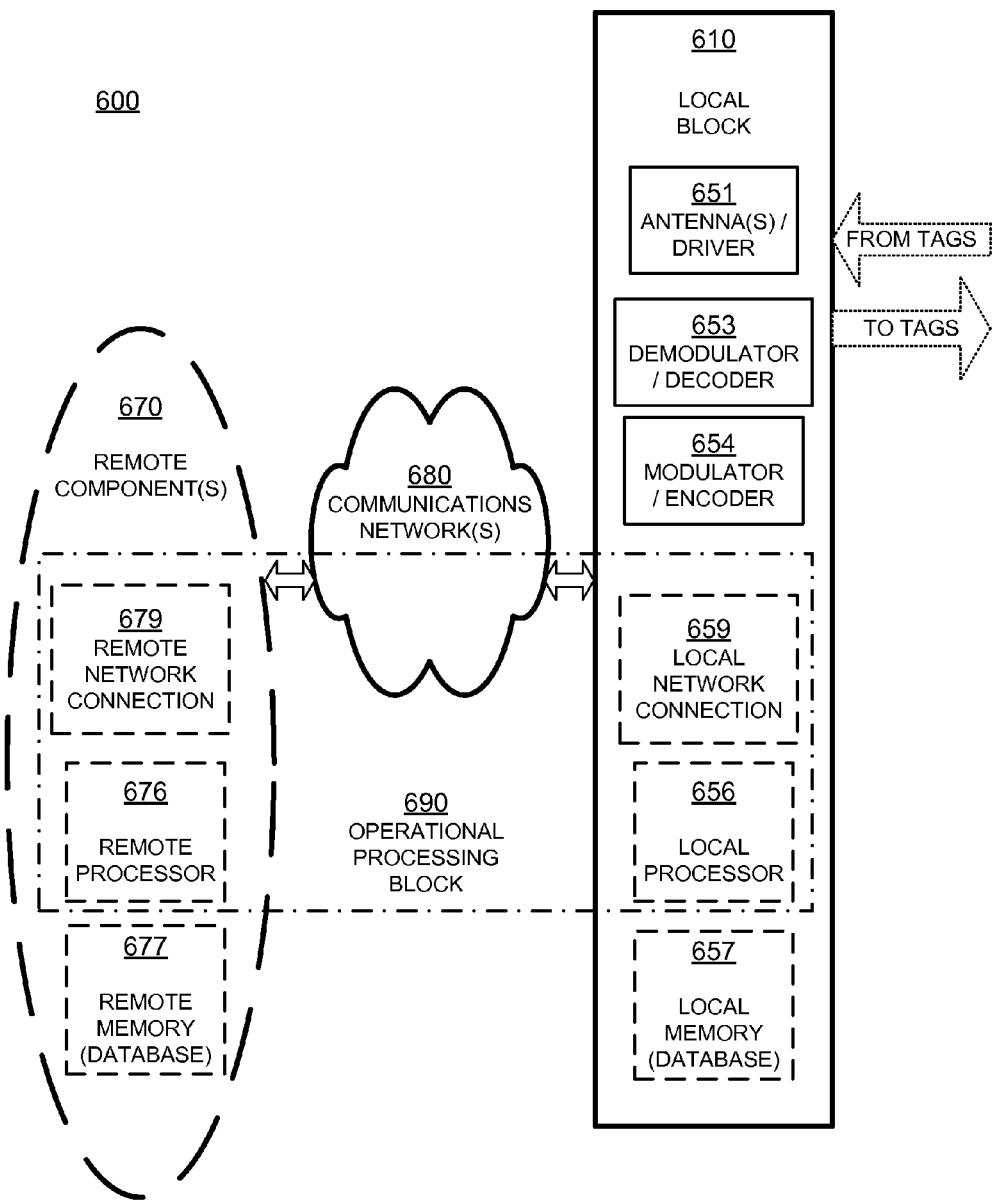
FIG. 6 is a block diagram of an RFID reader system 600 according to embodiments.

FIG. 6 is a block diagram of an RFID reader system 600 according to embodiments. RFID reader system 600 includes a local block 610, and optionally remote components 670. Local block 610 and remote components 670 can be implemented in any number of ways. It will be recognized that RFID reader 110 of FIG. 1 is the same as local block 610, if remote components 670 are not provided. Alternately, RFID reader 110 can be implemented instead by RFID reader system 600, of which only the local block 610 is shown in FIG. 1.

In some embodiments, one or more of the blocks or components of reader system 600 may be implemented as integrated circuits. For example, local block 610, one or more of the components of local block 610, and/or one or more of the remote component 670 may be implemented in CMOS technology, BJT technology, MESFET technology, and/or any other suitable implementation technology.

Local block 610 is responsible for communicating with the tags. Local block 610 includes a block 651 of an antenna and a driver of the antenna for communicating with the tags. Some readers, like that shown in local block 610, contain a single antenna and driver. Some readers contain multiple antennas and drivers and a method to switch signals among them, including sometimes using different antennas for transmitting and for receiving. Some readers contain multiple antennas and drivers that can operate simultaneously. A demodulator/decoder block 653 demodulates and decodes backscattered waves received from the tags via antenna/driver block 651. Modulator/encoder block 654 encodes and modulates an RF wave that is to be transmitted to the tags via antenna/driver block 651.

Local block 610 additionally includes an optional local processor 656. Local processor 656 may be implemented in any number of ways known in the art. Such ways include, by way of examples and not of limitation, digital and/or analog processors such as microprocessors and digital-signal processors (DSPs); controllers such as microcontrollers; software running in a machine such as a general purpose computer; programmable circuits such as Field Programmable Gate Arrays (FPGAs), Field-Programmable Analog Arrays (FPAAs), Programmable Logic Devices (PLDs), Application Specific Integrated Circuits (ASIC), any combination of one or more of these; and so on. In some cases, some or all of the decoding function in block 653, the encoding function in block 654, or both, may be performed instead by local processor 656. In some cases local processor 656 may implement an encryption or authentication function; in some cases one or more of these functions can be distributed among other blocks such as encoding block 654, or may be entirely incorporated in another block.

Local block 610 additionally includes an optional local memory 657. Local memory 657 may be implemented in any number of ways known in the art, including, by way of example and not of limitation, any of the memory types described above as well as any combination thereof. Local memory 657 can be implemented separately from local processor 656, or in an IC with local processor 656, with or without other components. Local memory 657, if provided, can store programs for local processor 656 to run, if needed.

In some embodiments, local memory 657 stores data read from tags, or data to be written to tags, such as Electronic Product Codes (EPCs), Tag Identifiers (TIDs) and other data. Local memory 657 can also include reference data that is to be compared to EPCs, instructions and/or rules for how to encode commands for the tags, modes for controlling antenna 651, secret keys, key pairs, and so on. In some of these embodiments, local memory 657 is provided as a database.

Some components of local block 610 typically treat the data as analog, such as the antenna/driver block 651. Other components such as local memory 657 typically treat the data as digital. At some point there is a conversion between analog and digital. Based on where this conversion occurs, a reader may be characterized as "analog" or "digital", but most readers contain a mix of analog and digital functionality.

If remote components 670 are provided, they are coupled to local block 610 via an electronic communications network 680. Network 680 can be a Local Area Network (LAN), a Metropolitan Area Network (MAN), a Wide Area Network (WAN), a network of networks such as the internet, or a local communication link, such as a USB, PCI, and so on. Local block 610 may include a local network connection 659 for communicating with communications network 680. Communications on the network can be secure, such as if they are encrypted or physically protected, or insecure if they are not encrypted or otherwise protected.

There can be one or more remote component(s) 670. If more than one, they can be located at the same location, or in different locations. They can access each other and local block 610 via communications network 680, or via other similar networks, and so on. Accordingly, remote component(s) 670 can use respective remote network connections. Only one such remote network connection 679 is shown, which is similar to local network connection 659, etc.

Remote component(s) 670 can also include a remote processor 676. Remote processor 676 can be made in any way known in the art, such as was described with reference to local processor 656. Remote processor 676 may also implement an authentication function, similar to local processor 656.

Remote component(s) 670 can also include a remote memory 677. Remote memory 677 can be made in any way known in the art, such as was described with reference to local memory 657. Remote memory 677 may include a local database, and a different database of a standards organization, such as one that can reference EPCs. Remote memory 677 may also contain information associated with commands, tag profiles, keys, or the like, similar to local memory 657.

Of the above-described elements, it may be useful to consider a combination of these components, designated as operational processing block 690. Operational processing block 690 includes those components that are provided of the following: local processor 656, remote processor 676, local network connection 659, remote network connection 679, and by extension an applicable portion of communications network 680 that links remote network connection 679 with local network connection 659. The portion can be dynamically changeable, etc. In addition, operational processing block 690 can receive and decode RF waves received via antenna/driver 651, and cause antenna/driver 651 to transmit RF waves according to what it has processed.

Operational processing block 690 includes either local processor 656, or remote processor 676, or both. If both are provided, remote processor 676 can be made such that it operates in a way complementary with that of local processor 656. In fact, the two can cooperate. It will be appreciated that operational processing block 690, as defined this way, is in communication with both local memory 657 and remote memory 677, if both are present.

Accordingly, operational processing block 690 is location independent, in that its functions can be implemented either by local processor 656, or by remote processor 676, or by a combination of both. Some of these functions are preferably implemented by local processor 656, and some by remote processor 676. Operational processing block 690 accesses local memory 657, or remote memory 677, or both for storing and/or retrieving data.

RFID reader system 600 operates by operational processing block 690 generating communications for RFID tags. These communications are ultimately transmitted by antenna/driver block 651, with modulator/encoder block 654 encoding and modulating the information on an RF wave. Then data is received from the tags via antenna/driver block 651, demodulated and decoded by demodulator/decoder block 653, and processed by operational processing block 690.

Embodiments of an RFID reader system can be implemented as hardware, software, firmware, or any combination. Such a system may be subdivided into components or modules. A person skilled in the art will recognize that some of these components or modules can be implemented as hardware, some as software, some as firmware, and some as a combination. An example of such a subdivision is now described, together with the RFID tag as an additional module.

Figure 7:
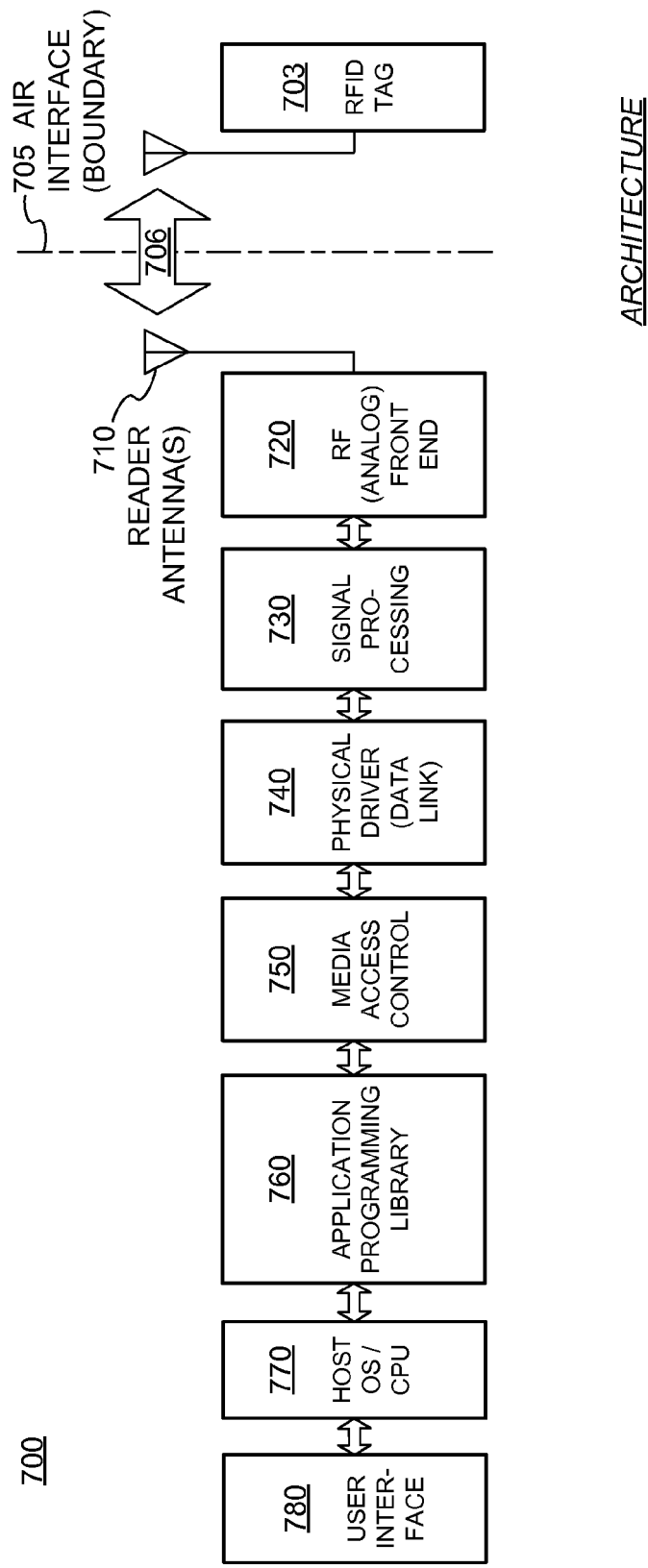
FIG. 7 is a block diagram illustrating an overall architecture of an RFID system 700 according to embodiments.

FIG. 7 is a block diagram illustrating an overall architecture of an RFID system 700 according to embodiments. RFID system 700 may be subdivided into modules or components, each of which may be implemented by itself or in combination with others. In addition, some of them may be present more than once. Other embodiments may be equivalently subdivided into different modules. Some aspects of FIG. 7 are parallel with systems, modules, and components described previously.

An RFID tag 703 is considered here as a module by itself. RFID tag 703 conducts a wireless communication 706 with the remainder, via the air interface 705. Air interface 705 is really a boundary, in that signals or data that pass through it are not intended to be transformed from one thing to another. Specifications as to how readers and tags are to communicate with each other, for example the Gen2 Specification, also properly characterize that boundary as an interface.

RFID system 700 includes one or more reader antennas 710, and an RF front-end module 720 for interfacing with reader antenna(s) 710. These can be made as described above.

RFID system 700 also includes a signal-processing module 730. In one embodiment, signal-processing module 730 exchanges waveforms with RF front-end module 720, such as I and Q waveform pairs.

RFID system 700 also includes a physical-driver module 740, which is also known as data-link module. In some embodiments physical-driver module 740 exchanges bits with signal-processing module 730. Physical-driver module 740 can be the stage associated with the framing of data.

RFID system 700 additionally includes a media access control module 750. In one embodiment, media access control layer module 750 exchanges packets of bits with physical driver module 740. Media access control layer module 750 can make decisions for sharing the medium of wireless communication, which in this case is the air interface.

RFID system 700 moreover includes an application-programming library-module 760. This module 760 can include application programming interfaces (APIs), other objects, etc.

All of these RFID system functionalities can be supported by one or more processors. One of these processors can be considered a host processor. Such a host processor might include a host operating system (OS) and/or central processing unit (CPU), as in module 770. In some embodiments, the processor is not considered as a separate module, but one that includes some of the above-mentioned modules of RFID system 700.

User interface module 780 may be coupled to application-programming-library module 760, for accessing the APIs. User interface module 780 can be manual, automatic, or both. It can be supported by the host OS/CPU module 770 mentioned above, or by a separate processor, etc.

It will be observed that the modules of RFID system 700 form a chain. Adjacent modules in the chain can be coupled by appropriate instrumentalities for exchanging signals. These instrumentalities include conductors, buses, interfaces, and so on. These instrumentalities can be local, e.g. to connect modules that are physically close to each other, or over a network, for remote communication.

The chain is used in one direction for receiving RFID waveforms and in the other direction for transmitting RFID waveforms. In receiving mode, reader antenna(s) 710 receives wireless waves, which are in turn processed successively by the various modules in the chain. Processing can terminate in any one of the modules. In transmitting mode, waveform initiation can be in any one of the modules. Ultimately, signals are routed to reader antenna(s) 710 to be transmitted as wireless waves.

The architecture of RFID system 700 is presented for purposes of explanation, and not of limitation. Its particular, subdivision into modules need not be followed for creating embodiments. Furthermore, the features of the present disclosure can be performed either within a single one of the modules, or by a combination of them.

Figure 8A:
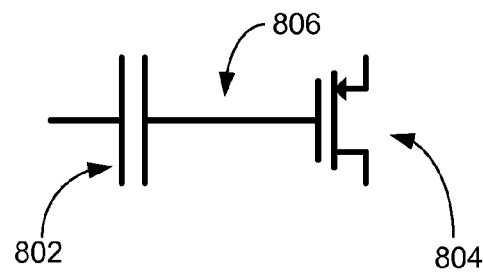
FIG. 8A depicts a single-ended memory cell with a floating-gate transistor.

As described above in FIG. 4, an RFID integrated circuit may include a memory 450 which in some embodiments is implemented as nonvolatile memory cells. One way to implement a nonvolatile memory cell is by using one or more floating-gate transistors. FIG. 8A depicts a single-ended memory cell 800 with a floating-gate transistor. A floating-gate transistor has a "floating" gate that is electrically isolated such that charge stored on the gate tends to remain on the gate. In one embodiment, the floating gate may be implemented using a conductive layer separated from a transistor control gate by a dielectric layer and separated from a transistor channel by another dielectric layer. In another embodiment, a floating gate 806 may be implemented by coupling a capacitor 802 to the gate of a transistor 804. The gate of transistor 804, along with the coupled capacitor terminal, serves as the floating gate 806, and the other terminal of capacitor 802 may serve as the control gate for the floating gate device. Data stored at nonvolatile memory cell 800 may be represented by the amount of charge (or the number of charge carriers) residing on the floating gate 806. For example, an amount of charge less than a particular threshold may be considered a binary "0", whereas an amount of charge more than the particular threshold may be considered a binary "1", or vice-versa. While the floating gate 806 is electrically isolated from the other terminal of capacitor 802 and the channel of transistor 804, charge on the floating gate 806 creates a potential at the channel or transistor 804, thereby influencing the transistor's electrical properties. For example, the current through transistor 804 under particular operating conditions may vary as a function of the potential at the transistor channel created by charge stored on the floating gate 806. The potential at the channel in turn may vary as a function of the amount of charge stored on the floating gate 806. As a result, the amount of charge stored on floating gate 806 may be indirectly determined based on the current though transistor 804, allowing the data represented by the stored charge to be read.

In general, charge stored on a floating gate tends to stay on the floating gate due to its electrical isolation, allowing the floating gate to maintain its written data. However, specialized write operations may be used to change the amount of charge stored on the floating gate, thereby modifying the stored data. During such write operations, charge carriers such as electrons may be added to or removed from floating gate 806 by applying sufficiently high potentials to cause charge tunneling between floating gate 806 and the other terminal of capacitor 802 and/or the channel of transistor 804.

Figure 8B:
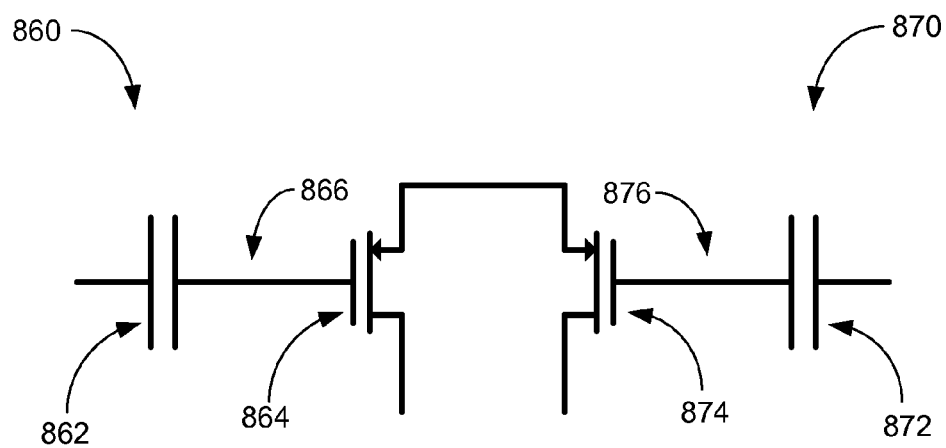
FIG. 8B depicts a differential bitcell with two floating-gate transistors.

In some embodiments, data may be represented as the difference between the charge stored on different floating gates instead of the charge stored on a single floating gate. FIG. 8B depicts a differential bitcell 850 with two floating-gate transistors. A "bitcell" may be a structure configured to store a single bit of data. For example, memory cell 800 may be considered a bitcell. While the bitcells described herein are implemented with one or more transistors, in other embodiments, bitcells may be implemented using any other suitable technology or component.

Differential bitcell 850 includes two floating-gate transistors 860 and 870, each having a capacitor (862 and 872, respectively) coupled to a transistor (864 and 874, respectively) to form a floating gate (866 and 876, respectively). In this situation, data stored on differential bitcell 850 may not be represented by the absolute values of the charge stored at the floating-gate transistors 860/870, but rather by the relationship between the currents through the (channels of) floating-gate transistors 860/870. In this situation, the bitcell 850 may store a binary "0" if floating-gate transistors 860 and 870 each store charge such that, under a particular operating condition (e.g., particular biasing of transistors 860/870), the channel current through floating-gate transistor 860 is smaller in magnitude than the channel current through floating-gate transistor 870. Similarly, the bitcell 850 may store a binary "1" if floating-gate transistors 860 and 870 each store charge such that, under a particular operating condition, the channel current through floating-gate transistor 860 is larger in magnitude than the channel current through floating-gate transistor 870. The data stored at bitcell 850 may therefore be read by comparing the output currents of transistors 860 and 870. In some embodiments, data may be represented directly as the difference between the output currents of transistors 860 and 870. This differs from the situation described above because the charge stored by floating-gate transistor 860 may not have to be larger than the charge stored by floating-gate transistor 870 in order to result in the output current of transistor 864 being larger than the output current of transistor 874. This may result due to transistor dimensional and fabrication differences.

Figure 9:
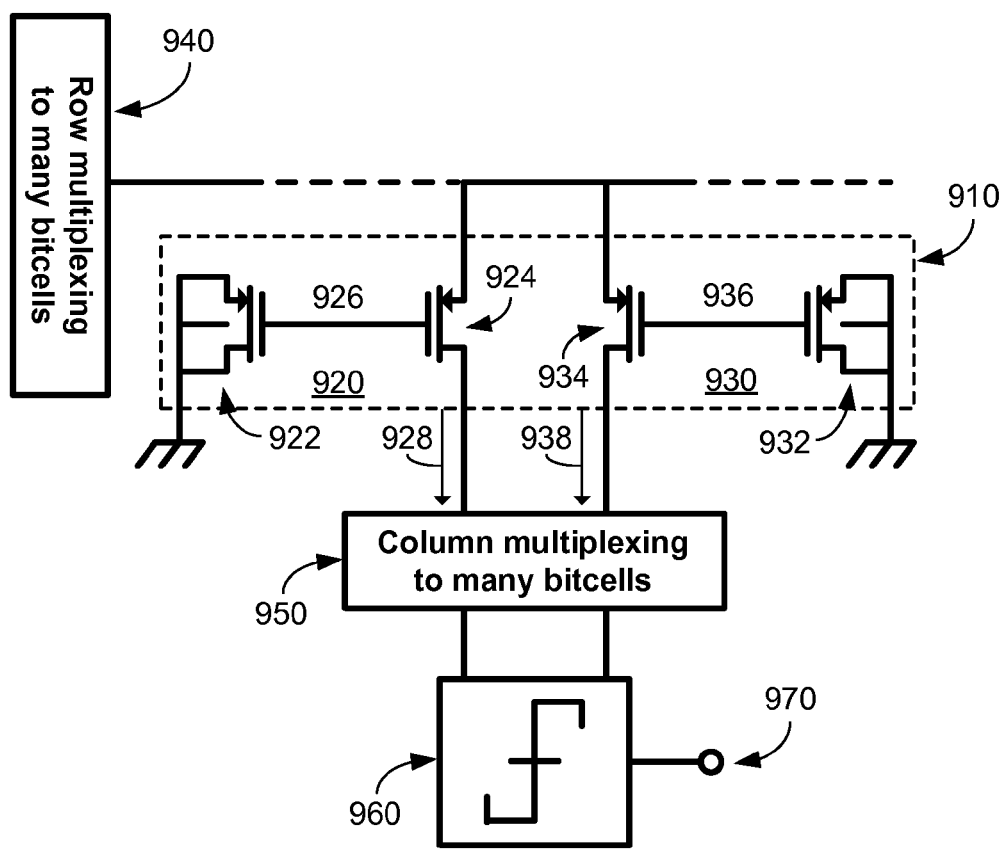
FIG. 9 depicts a structure configured to perform a read on a differential bitcell.

FIG. 9 depicts a structure 900 configured to perform a read on a differential bitcell 910. The differential bitcell 910 is similar to differential bitcell 850 described in FIG. 8, and has two floating-gate transistors 920 and 930, each with a transistor configured as a capacitor (922 and 932) and coupled to the gate of a main transistor (924 and 934) to form a floating gate (926 and 936). The transistors 922 and 932 may be configured as capacitors by coupling their gates to the gates of their respective main transistors and their drain, source, and bulk terminals to ground.

A typical NVM includes multiple bitcells such as bitcell 910 arranged in an array and coupled to row multiplexing logic 940 and column multiplexing logic 950. A readout sense amplifier or comparator 960 receives and compares output currents 928 and 938 from floating-gate transistors 920 and 930, respectively, and provides an output signal on digital output 970 indicating whether bitcell 910 stores a "0" or "1" based on the current comparison.

Floating-gate devices are generally designed to electrically isolate the floating gate so that charge stored on the floating gate (representing stored data) stays on the floating gate. However, in certain circumstances charge on the floating gate may leak away from the floating gate, potentially degrading the stored data. Such leakage may be due to incomplete, problematic, failed, truncated, or partial write operations, or decay over time. For example, if stored charge above a certain threshold represents a binary "1" and below the threshold represents a binary "0", a problematic or failed write operation intended to write a "1" value on a floating gate may not supply enough charge to meet the threshold. Similarly, a floating gate that originally stored sufficient charge to represent a "1" may over time leak enough charge to reduce the stored charge below the threshold, causing the "1" to decay to a "0".

In some embodiments, it may be useful to determine how close data stored using floating-gate devices is to decaying below the threshold delineating a "0" data value from a "1" data value. For example, an entity may wish to calibrate and/or characterize the data storage properties of a floating-gate memory device (e.g., how well the memory device maintains stored data) after manufacture, physical processing, and/or programming. As another example, a recipient of a floating-gate memory device may wish to determine whether any data originally written to the memory device remains correctly written on the device, and may also wish to detect any failing memory cells and reprogram those cells as needed to avoid excessive memory wear.

For example, a floating-gate device may originally store sufficient charge to represent a "1". Subsequently, charge may leak from the floating-gate device, reducing the stored charge to just above the threshold separating "0" and "1" values. While the floating-gate device still stores the correct data ("1"), the data is close to degrading because the stored charge is close to the threshold. The likelihood of data decay in such a situation may be characterized by a "margin". The margin is a measure of how close data stored at a floating-gate device is to decaying, or alternately how strongly data is written to or encoded on the floating-gate device, and may be represented by a probability, a charge difference, a voltage difference, a current difference, and/or any other suitable parameter. For a floating-gate device such as single-ended memory cell 800 where the stored data value is represented by the amount of charge stored as compared to a threshold, the margin may be the difference between the stored charge and the threshold. For example, suppose that a floating-gate device stores a "1" when the charge stored on the floating-gate is above a charge threshold, and the device stores a "0" when the charge stored on the floating-gate is below the charge threshold. When the device stores a "1", the margin associated with the device may be the amount of charge stored on the floating-gate in excess of the charge threshold. When the device stores a "0", the margin associated with the device may be the amount of additional charge required to bring the charge stored on the floating-gate up to the charge threshold.

For a differential floating-gate device such as differential bitcell 910, the margin may be represented by the difference in the output current 928 of transistor 864 and the output current 938 under similar operating conditions, which in turn is related to differences in stored charge at floating gates 926 and 936.

While in the description above a binary "1" may be represented by stored charge at a floating-gate device above a particular threshold and a binary "0" may be represented by stored charge below the particular threshold, in other embodiments the reverse may be true. Similarly, in some situations the techniques described herein may be applicable to floating-gate devices capable of storing multiple bits of information (e.g., triple-level or multi-level cells).

Figure 10:
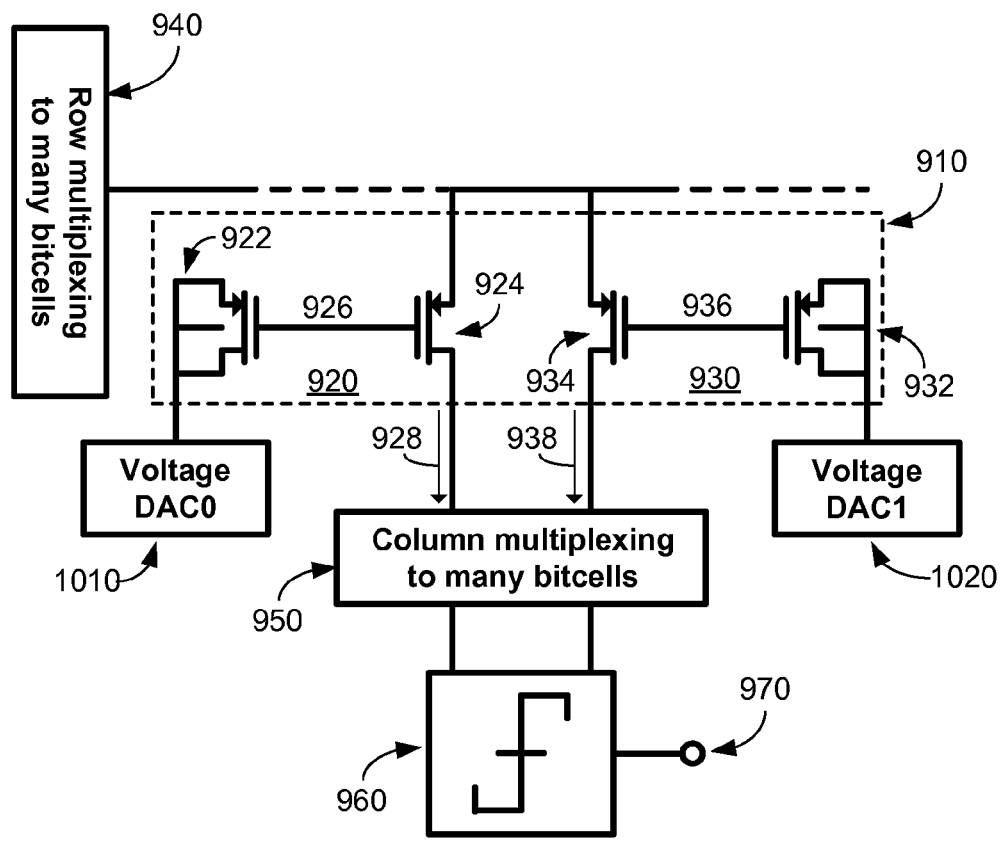
FIG. 10 depicts a structure configured to perform a voltage-based margin read on a differential bitcell.

FIG. 10 depicts a structure 1000 configured to perform a voltage-based margin read on differential bitcell 910. Structure 1000 is similar to structure 900 in FIG. 9, with similarly-numbered elements behaving similarly. However, in structure 1000 the capacitor-configured transistors 922 and 932 have their drain, source, and bulk terminals coupled to voltage digital-to-analog converters (DACs) 1010 and 1020, respectively. As mentioned above, charge stored on floating gates (e.g., 926/936) influence device behavior by creating a potential at the channel of their corresponding transistors (e.g., 924/934), which affects the corresponding output currents (e.g., output currents 928 or 938). The voltage DACs 1010 and 1020 in turn allow biasing of transistors 922 and 932 and adjustment of their transistor channel potentials. For example, the voltage DACs 1010/1020 convert digital signals into analog voltages, which may then be applied at the drain, source, and bulk terminals of capacitor-configured transistors 922 and 932. This modifies the potential at the floating gates 926/936 via the gates of transistors 922/932, which in turn modifies the potential at the channels of transistors 924/934. As a result, digital input signals at the voltage DACs 1010/1020 are converted to changes in potential at the channels of transistors 924/934, which in turn cause changes in output currents 928/938 and potentially cause output 970 to change. In some embodiments, the voltage DACs 1010/1020 (and also the voltage DACs 1110/1120 below) may be implemented using single-threshold references or supplies.

By varying the DAC input signals and monitoring the output 970, the potential difference required to switch the data value stored at bitcell 910 as seen at output 970 can be determined. This potential difference in turn may be used to determine the margin associated with the data stored at bitcell 910. For example, stored data with a relatively larger margin may require a relatively larger potential difference to be applied using voltage DACs 1010/1020 to cause output 970 to switch, whereas stored data with a relatively smaller margin may require a relatively smaller applied potential difference to cause output 970 to switch. Accordingly, the margin of data stored at bitcell 910 may be determined using the voltage DACs 1010/1020.

Figure 11:
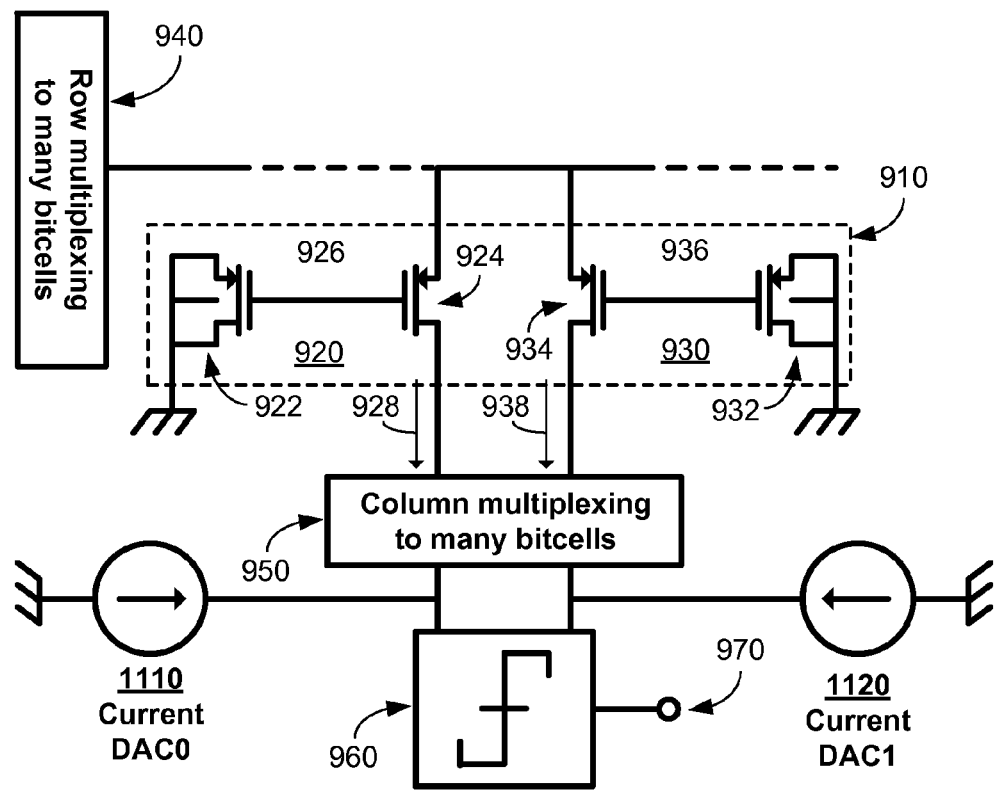
FIG. 11 depicts another structure configured to perform a current-based margin read on a differential bitcell.

FIG. 11 depicts another structure 1100 configured to perform a current-based margin read on a differential bitcell 910. Structure 1100 is similar in some respects to structures 1000 and 900, with similarly-numbered elements behaving similarly. However, structure 1100 uses a current-based approach to determine the margin of data stored at bitcell 910. Structure 1100 includes current DAC 1110 coupled to one terminal of sense amplifier 960 and current DAC 1120 coupled to another terminal of sense amplifier 960. Current DACs 1110/1120, similar to voltage DACs 1010/1020 above, convert digital input signals into analog outputs. However, instead of converting the input signals into analog voltages, current DACs 1110/1120 convert the input signals into analog currents. As mentioned above, differences in stored charge at floating gates 926 and 936 result in different output currents 928 and 938, which sense amplifier 960 then converts into a data value. The current DACs 1110 and 1120 are configured to directly modify the output currents 928/938, thereby biasing sense amplifier 960. By varying the DAC input signals and monitoring the output 970, the current difference required to switch the data value stored at bitcell 910 as seen at output 970 can be determined. This current difference in turn may be used to determine the margin associated with the data stored at bitcell 910. For example, stored data with a relatively larger margin may require a relatively larger current difference to be applied using current DACs 1110/1120 to cause output 970 to switch, whereas stored data with a relatively smaller margin may require a relatively smaller applied potential difference to cause output 970 to switch. Accordingly, the margin of data stored at bitcell 910 may be determined using the current DACs 1110/1120.

As mentioned previously, embodiments are directed to determining the margin associated with stored data. Embodiments additionally include programs, and methods of operation of the programs. A program is generally defined as a group of steps or operations leading to a desired result, due to the nature of the elements in the steps and their sequence. A program is usually advantageously implemented as a sequence of steps or operations for a processor, but may be implemented in other processing elements such as FPGAs, DSPs, or other devices as described above.

Performing the steps, instructions, or operations of a program requires manipulating physical quantities. Usually, though not necessarily, these quantities may be transferred, combined, compared, and otherwise manipulated or processed according to the steps or instructions, and they may also be stored in a computer-readable medium. These quantities include, for example, electrical, magnetic, and electromagnetic charges or particles, states of matter, and in the more general case can include the states of any physical devices or elements. It is convenient at times, principally for reasons of common usage, to refer to information represented by the states of these quantities as bits, data bits, samples, values, symbols, characters, terms, numbers, or the like. It should be borne in mind, however, that all of these and similar terms are associated with the appropriate physical quantities, and that these terms are merely convenient labels applied to these physical quantities, individually or in groups.

Embodiments furthermore include storage media. Such media, individually or in combination with others, have stored thereon instructions, data, keys, signatures, and other data of a program made according to the embodiments. A storage medium according to the embodiments is a computer-readable medium, such as a memory, and is read by a processor of the type mentioned above. If a memory, it can be implemented in a number of ways, such as Read Only Memory (ROM), Random Access Memory (RAM), etc., some of which are volatile and some nonvolatile.

Even though it is said that the program may be stored in a computer-readable medium, it should be clear to a person skilled in the art that it need not be a single memory, or even a single machine. Various portions, modules or features of it may reside in separate memories, or even separate machines. The separate machines may be connected directly, or through a network such as a local access network (LAN) or a global network such as the Internet.

Often, for the sake of convenience only, it is desirable to implement and describe a program as software. The software can be unitary, or thought of in terms of various interconnected distinct software modules.

Figure 12:
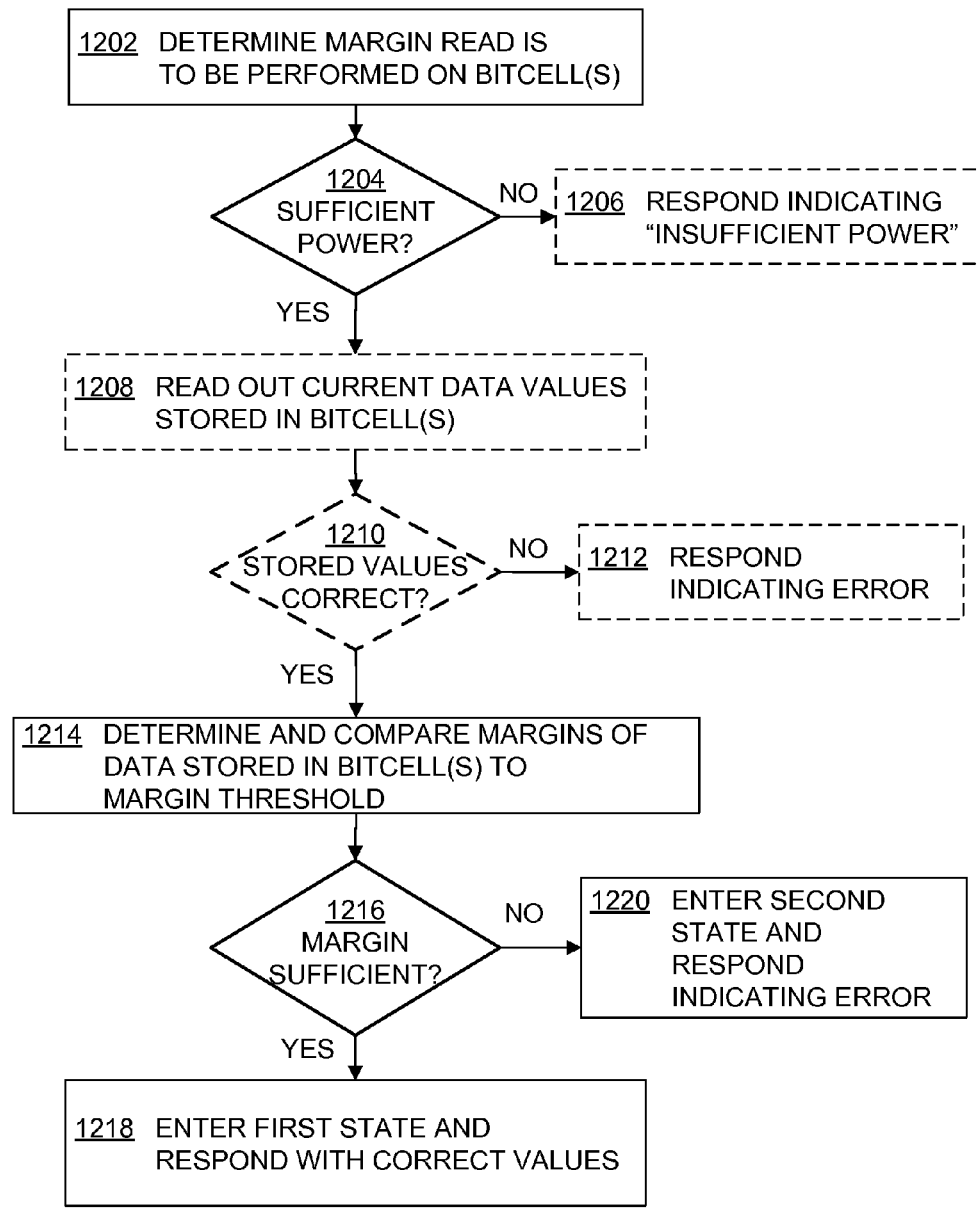
FIG. 12 is a flowchart illustrating a margin read process for an RFID tag IC.

FIG. 12 is a flowchart illustrating a margin read process 1200 for an RFID tag IC. At operation 1202, a memory controller of the tag IC may determine that a margin read is to be performed on one or more bitcells in a memory. The margin read may be performed in response to receiving a wireless margin read command from a reader, receiving a wireless memory read command, periodically based on a schedule or timer, upon power-up of the tag IC, upon a power-on-reset (POR) event (e.g., where the tag IC resets its operation while still receiving power), or based on any other suitable criteria. The bitcell(s) on which the margin read is to be performed may be indicated in the received command, may be known a priori to the memory controller, or may be determined dynamically. For example, a received command may indicate that margin reads should be performed on all bitcells in the memory or only some of the bitcells (indicated via an address range or any other suitable selector).

At operation 1204 the memory controller may evaluate whether sufficient power is available to perform the margin read. For example, the memory controller may compare the received power level or power stored at the tag IC to a margin read power level requirement.

If at operation 1204 the memory controller determines that sufficient power is not available to perform the margin read, and a margin read or memory read command was received at operation 1202, at optional operation 1206 the tag IC may respond indicating that it has insufficient power to perform the margin read, and may end the margin read process. If the memory controller did not initiate the margin read process in response to a command, then the tag IC may not respond upon determining that insufficient power is available. However, in some embodiments the tag IC or the memory controller may store an indication of the attempted margin read and/or the power insufficiency, for example, by adjusting a flag or storing data in one or more registers or NVM portions.

On the other hand, if at operation 1204 the memory controller determines that sufficient power is available to perform the margin read, at optional operation 1208 the memory controller may first attempt to read out the current data values stored in the bitcell(s) on which the margin read is to be performed. Subsequently, at optional operation 1210 the memory controller may determine whether the data values read out at optional operation 1208 are correct. For example, the memory controller may compare the data values read out at optional operation 1208 to correct data values and/or check codes (e.g., parity bits, checksums, cyclic redundancy checks, hash function outputs, error-correcting codes, etc.) for the correct data values. In some embodiments, the memory controller may retrieve the correct data values and/or check codes from a previously-received command (e.g. received at operation 1202) and/or a different storage location on the tag IC.

If at optional operation 1210 the memory controller determines that the stored data values are not correct, then at optional operation 1212 the tag IC may respond indicating that it has a memory error. If the memory controller did not initiate the margin read process in response to a command, then the tag IC may not respond upon determining that the stored data values are incorrect. However, the tag IC or the memory controller may store an indication of the attempted margin read and/or the incorrect data values, for example, by adjusting a flag or storing data in one or more registers or NVM portions. In some embodiments, the tag IC or the memory controller may attempt to reconstruct the incorrect data, for example, using error-correction codes or copying known, correct data to the bitcells storing the incorrect data.

On the other hand, if at optional operation 1210 the memory controller determines that the stored data values are correct, or if optional operation 1208 is not performed, at operation 1214 the memory controller may determine and compare the margins of the data stored in the bitcells to a margin threshold. The memory controller may determine the data margins by biasing the bitcells, the entire NVM, and/or a readout sense amplifier (e.g., sense amplifier 960). In some embodiments, the memory controller may use one or more voltage DACs (e.g., voltage DACs 1010/1020) to bias capacitor-configured transistors associated with individual bitcells or the entire NVM. The memory controller may also (or instead) use one or more current DACs (e.g., current DACs 1110/1120 to bias readout sense amplifiers (e.g., sense amplifier 960).

In some embodiments, the memory controller determines the bias to be applied based on the data stored in the bitcells. For example, suppose that a differential bitcell (e.g., bitcell 910) stores a "0" data value such that a first output current (e.g., output current 928) is larger than a second output current (e.g., output current 938). In this situation, the memory controller may bias the transistors in the bitcell and/or the readout sense amplifier to oppose the output of the differential bitcell, such that the second output current increases with respect to the first output current. If the differential bitcell stores a "1" data value such that the first output current is smaller than the second output current, then the memory controller may again bias the transistors in the bitcell and/or the readout sense amplifier to oppose the bitcell output, such that the first output current increases with respect to the second output current. The magnitude of the bias that is sufficient to cause the first and second output currents to become substantially equal may be representative of the margin of the stored data value, and the memory controller may determine the margin of the stored data value from the bias magnitude. In some embodiments, the memory controller may determine the bias that causes the first and second output currents to become substantially equal by increasing the bias magnitude until the bitcell output (e.g., output 970) switches from the stored data value to the opposite value.

Subsequently, the memory controller or the tag IC may compare the data value margin to a margin threshold to determine whether the data value margin is sufficient. The margin threshold may be a margin value that, when satisfied by the margin of a bitcell-stored data value, indicates that the data value is adequately or sufficiently written to the bitcell. In other words, if the memory controller determines that the margin of a data value stored on a bitcell is at least equal to the margin threshold, the memory controller may consider the data value strongly-written to the bitcell. The margin threshold may be predetermined by a tag IC manufacturer, a tag manufacturer, and/or a user, or may be dynamically determined by the tag IC. The margin threshold may be stored or otherwise encoded onto a tag IC, or may be provided to the tag IC via a command for subsequent use. In single-ended memory cells such as memory cell 800, the margin threshold may be an absolute voltage or current value. In differential bitcells such as bitcell 910, the margin threshold may instead be a differential threshold, which may represent a difference or delta in voltage or current. A differential threshold may also have a sign to indicate the direction of the difference.

In some embodiments, instead of determining the specific bias magnitude necessary to cause the first and second output currents to become substantially equal and then comparing to the margin threshold, the memory controller may directly bias the bitcells, NVM, and/or the readout sense amplifier to the margin threshold, opposing the bitcell output. In other words, the memory controller may use the margin threshold as the bias to be applied. The memory controller may then determine whether the bitcell output is still the stored data value, despite the biasing, or whether the bitcell output has switched from the stored data value to the opposite value. If the bitcell output is still the stored data value despite the biasing, then the data value margin is at least equal to the margin threshold, and the memory controller may consider the data value margin sufficient. On the other hand, if the bitcell output has switched due to the biasing, then the data value margin is less than the margin threshold, and the memory controller may consider the data value margin insufficient.

In embodiments where the bitcells include single-ended memory cells similar to memory cell 800, the memory controller may use a similar approach to determine margin. However, instead of determining the margin based on the bias magnitude required to cause two output currents to be substantially equal, the memory controller determines the margin based on the bias magnitude required to cause the single-ended memory cell to switch its output data value, represented for example, as an output voltage or an output current.

At operation 1216, the memory controller determines whether the margins of the data stored in the bitcells are sufficient, based on the margin determination and comparison performed at operation 1214. As described above, the memory controller may consider data margins sufficient if they at least equal a margin threshold. If the memory controller determines that the data margins are sufficient, then at operation 1218 the tag IC may enter a first state in which the data stored on the tested bitcells (i.e., the bitcells that have undergone the margin read) are confirmed to have adequate margin. In some embodiments, the memory controller or tag IC may adjust an IC flag or memory indicator to a first value to indicate that the tag IC is in the first state. In the first state, the tag IC may be configured to respond to commands requesting the data values stored on the tested bitcells with the data values. The tag IC may also be configured to store and/or transmit an indication of the magnitude of the margin (e.g., a voltage, current, charge, or parameter indicating how large the margin is).

On the other hand, if at operation 1216 the memory controller determines that the data margin associated with at least one of the tested bitcells is insufficient, then at operation 1220 the tag IC may enter a second state in which the data stored on the tested bitcells do not have adequate margin. In some embodiments, the memory controller or tag IC may adjust the IC flag or memory indicator referred to above to a second value different from the first value to indicate that the tag IC is in the second state.

In the second state, the tag IC may be configured to respond to commands requesting the data values stored on the tested bitcells by not transmitting the data values and instead indicating an error. For example, the tag IC may respond with an error code or message, or may respond with the state of the IC flag or memory indicator. In some embodiments, the tag IC may transmit the data values and also indicate an error. Similar to operation 1218, the tag IC may also be configured to store and/or transmit an indication of the magnitude of the margin (e.g., a voltage, current, charge, or parameter indicating how large the margin is).

In some embodiments, the tag IC may include alternative data along with the error indication in its response. The alternative data may be a different version of the data stored on the tested bitcells, a truncated version of the data stored on the tested bitcells, or entirely different data. For example, the alternative data may include a tag or IC identifier (e.g., EPC or TID), a truncated or modified version of the tag or IC identifier, a truncated or modified version of the stored data, or some other data, such as a series of zeroes or ones or some other binary pattern that indicate an error has occurred. The tag IC may include both the alternative and the stored data, or portions of one or both data, or other information that may be useful to a reader or to a reading system in the response. For example, if the tag IC receives a command from a reader requesting stored data that the tag IC has determined has insufficient margin, then the IC may include an error code, the stored data, and/or alternative data in its response.

In some cases the response may indicate the presence and/or nature of the included data. For example, the response may indicate that it includes data, and may also indicate whether the included data is the stored data, alternative data, or other data. In some embodiments, the response may include protocol control information (e.g., protocol control bits according to the Gen2 Specification) corresponding to data either included in the reply or stored in memory. Protocol control information associated with data may be used to indicate the length of the associated data. In some embodiments, stored data that is determined to have insufficient margin may in effect be altered by adjusting its associated protocol control information. For example, data may be shortened or even set to zero length (in effect "erasing" it) by adjusting its associated protocol control information. The adjusted protocol control information may then be included in the response to indicate that the stored data has some error or insufficient margin. In some embodiments, the response may also include an error-check code computed by the tag IC over the reply. For example, the tag IC may compute the error-check code based on one or more components of the response (e.g., the error indicator, the stored data, the alternative data, and/or any other data included in the reply) and include the computed error-check code in the response.

The operations described in process 1200 are for illustrative purposes only. These operations may be implemented using additional or fewer operations and in different orders using the principles described herein.

FIG. 13 depicts example command structures for a margin read command 1300 and a response 1350 to a margin read command, according to embodiments. Margin read command 1300, which may be transmitted by a reader to a tag or tag IC, may include a command code field 1302, a memory type field 1304, a bit pointer field 1306, a length field 1308, a mask field 1310, a random number (RN) field 1312, and a cyclic redundancy check (CRC) field 1314. Command code field 1302 may be 16 bits long, and may store a command code that identifies the command as a margin read command. Memory type field 1304 may be 2 bits long, and may identify the memory portion (e.g., an EPC memory, a TID memory, a user memory, or some other memory) upon which the margin read is to be performed. Bit pointer field 1306 may be an extensible bit vector (EBV) or some other extensible data format, and may indicate a starting bit address where the margin read is to be performed. Length field 1308 may be 8 bits long, and may identify the size of the memory portion upon which the margin read is to be performed, also represented by mask field 1310. Mask field 1310 may have variable length, also identified by length field 1308, and may contain a series of data values that is to be compared with the data stored on the tag IC in the memory portion indicated by memory type field 1304, bit pointer field 1306, and length field 1308. RN field 1312 may be 16 bits long and may store a temporary identifier (or "handle") for the tag IC, and CRC field 1314 may be 16 bits long and store an error-checking code for the command 1300.

Response 1350, which may be transmitted by a tag or tag IC in response to a margin read command, may include a 1-bit header field 1352, a 16-bit RN field 1354 that stores the handle, and a 16-bit CRC field 1356 that stores an error-checking code for the response 1350. In some embodiments, a tag or tag IC may transmit response 1350 only if a passing margin read (that is, all relevant bits have sufficient margin) was performed. The tag or tag IC may indicate a failing margin read, where at least one relevant bit has insufficient margin, by transmitting an error indication, as described above in operation 1220.

The foregoing detailed description has set forth various embodiments of the devices and/or processes via the use of block diagrams and/or examples. Insofar as such block diagrams and/or examples contain one or more functions and/or aspects, it will be understood by those within the art that each function and/or aspect within such block diagrams or examples may be implemented individually and/or collectively, by a wide range of hardware, software, firmware, or virtually any combination thereof. Those skilled in the art will recognize that some aspects of the RFID embodiments disclosed herein, in whole or in part, may be equivalently implemented employing integrated circuits, as one or more computer programs running on one or more computers (e.g., as one or more programs running on one or more computer systems), as one or more programs running on one or more processors (e.g. as one or more programs running on one or more microprocessors), as firmware, or as virtually any combination thereof, and that designing the circuitry and/or writing the code for the software and or firmware would be well within the skill of one of skill in the art in light of this disclosure.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, configurations, antennas, transmission lines, and the like, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

We claim:

1. A method for a Radio Frequency Identification (RFID) tag integrated circuit (IC) including a nonvolatile memory to determine whether a data value is encoded with adequate margin in at least one bitcell of the nonvolatile memory, the method comprising:
   receiving a wireless command instructing the IC to perform a margin read;
   performing the margin read to determine whether the margin exceeds a threshold by:
      biasing at least one of the bitcell, the nonvolatile memory, and a readout sense amplifier to the threshold; and
      determining whether a correct bitcell data value can be read from the bitcell despite the biasing; and
   responding with an error code if the determined margin is insufficient.

2. The method of claim 1, wherein the wireless command includes the correct bitcell data value.

3. The method of claim 1, wherein
   the wireless command includes correct bitcell data values for multiple bitcells and the method further comprises:
   determining, for each of the multiple bitcells, that the margin for each bitcell exceeds the threshold; and
   responding with an error code if the determined margin for any bitcell is insufficient.

4. The method of claim 1, further comprising:
   evaluating, prior to performing the margin read, whether the IC has sufficient power for determining the margin; and
   in response to determining that sufficient power is not available:
      refraining from determining the margin; and
      responding with an error code indicating the power insufficiency.

5. The method of claim 1, wherein the bitcell is differential and the biasing includes at least one of biasing the differential bitcell, the differential nonvolatile memory, and a differential readout sense amplifier to a differential threshold.

6. The method of claim 1, further comprising the IC reading the bitcell to determine a correct bitcell value prior to determining whether the margin exceeds the threshold.

7. The method of claim 6, further comprising:
   evaluating, prior to performing the margin read, whether the IC has sufficient power for determining the margin; and
   in response to determining that sufficient power is not available:
      refraining from determining the margin; and
      responding with an error code indicating the power insufficiency.

8. A method for a Radio Frequency Identification (RFID) tag integrated circuit (IC) including a nonvolatile memory to determine whether a data value is encoded with adequate margin in at least one bitcell of the nonvolatile memory, the method comprising:
   receiving sufficient RF energy to initiate a power-on-reset (POR) of the IC;

reading the bitcell subsequent to the POR to determine a correct bitcell value;
initiating a margin read subsequent to reading the bitcell, wherein the margin read includes determining, for the bitcell, whether the margin exceeds a threshold; and
entering a first state if the determined margin is sufficient and entering a second state if the determined margin is insufficient.

9. The method of claim 8, wherein determining whether the margin exceeds a threshold comprises:
biasing at least one of the bitcell, the nonvolatile memory, and a readout sense amplifier to the threshold; and
determining whether the correct bitcell data value can be read from the bitcell despite the biasing.

10. The method of claim 8, further comprising:
receiving a wireless command instructing the IC to respond with at least the bitcell data value, and
in response to receiving the wireless command:
sending at least the bitcell data value if the IC is in the first state; and
not sending the bitcell data value if the IC is in the second state.

11. The method of claim 10, further comprising sending an error indication if the IC is in the second state.

12. The method of claim 11, wherein the error indication includes an alternative identifier for the IC.

13. The method of claim 8, further comprising receiving a wireless command instructing the IC to perform the margin read, wherein the wireless command includes a correct bitcell data value.

14. The method of claim 13, further comprising:
biasing at least one of the bitcell, the nonvolatile memory, and a readout sense amplifier to the threshold; and
determining whether the correct bitcell data value can be read from the bitcell despite the biasing.

15. The method of claim 8, wherein:
entering the first state includes adjusting an IC flag to a first value; and
entering the second state includes adjusting the IC flag to a second value.

16. A Radio Frequency Identification (RFID) tag integrated circuit (IC) comprising:
a nonvolatile memory including at least one bitcell; and
a processor block coupled to the nonvolatile memory and configured to:
receive a wireless command instructing the IC to perform a margin read for the bitcell;
perform the margin read to determine whether a bitcell margin relative to the correct data value exceeds a threshold by:
biasing at least one of the bitcell, the nonvolatile memory, and a readout sense amplifier to the threshold; and
determining whether the correct bitcell data value can be read from the bitcell despite the biasing; and
respond with an error code upon determining the margin is insufficient.

17. The IC of claim 16, wherein the processor block is further configured to:
evaluate, prior to performing the margin read, whether the IC has sufficient power for determining the margin; and
in response to determining that sufficient power is not available:
refrain from determining the margin; and
respond with an error code indicating the power insufficiency.

* * * * *

UNITED STATES PATENT AND TRADEMARK OFFICE
CERTIFICATE OF CORRECTION

| | |
|---|---|
| PATENT NO. | : 9,607,191 B1 |
| APPLICATION NO. | : 14/737384 |
| DATED | : March 28, 2017 |
| INVENTOR(S) | : Charles Peach et al. |

It is certified that error appears in the above-identified patent and that said Letters Patent is hereby corrected as shown below:

In the Specification

Column 3, Line 35, After "signals)" insert -- . --.

Column 20, Line 50, Delete "and or" and insert -- and/or --, therefor.

Signed and Sealed this
Thirtieth Day of January, 2018

Joseph Matal
*Performing the Functions and Duties of the*
*Under Secretary of Commerce for Intellectual Property and*
*Director of the United States Patent and Trademark Office*